US011243226B2

(12) United States Patent
Li

(10) Patent No.: US 11,243,226 B2
(45) Date of Patent: Feb. 8, 2022

(54) COMPOSITE SENSOR AND MANUFACTURING METHOD THEREOF

(71) Applicant: AUTOCHIPS WUHAN CO., LTD., Wuhan (CN)

(72) Inventor: Senlin Li, Hefei (CN)

(73) Assignee: AUTOCHIPS WUHAN CO., LTD., Wuhan (CN)

( * ) Notice: Subject to any disclaimer, the term of this patent is extended or adjusted under 35 U.S.C. 154(b) by 126 days.

(21) Appl. No.: 16/790,784

(22) Filed: Feb. 14, 2020

(65) Prior Publication Data

US 2020/0319228 A1 Oct. 8, 2020

(30) Foreign Application Priority Data

Apr. 4, 2019 (CN) .......... 201910272024.5

(51) Int. Cl.
*G01P 15/125* (2006.01)
*G01P 1/02* (2006.01)
*G01L 9/00* (2006.01)
*G01P 15/12* (2006.01)
*G01L 19/00* (2006.01)
(Continued)

(52) U.S. Cl.
CPC .......... *G01P 15/125* (2013.01); *G01L 9/0042* (2013.01); *G01L 9/0052* (2013.01); *G01L 19/0092* (2013.01); *G01P 1/023* (2013.01); *G01P 15/123* (2013.01);
(Continued)

(58) Field of Classification Search
CPC ...... G01P 15/125; G01P 15/123; G01P 1/023; G01P 2015/0828; G01L 19/0092; G01L 9/0052; G01L 9/0042; G01L 27/005; G01L 1/20; B81B 2201/0264; B81B 2201/0235; B81B 7/02
See application file for complete search history.

(56) References Cited

U.S. PATENT DOCUMENTS 9,550,668 B1 * 1/2017 Xia .................. H01L 29/84
2006/0115102 A1 6/2006 Mullenborn et al.
2006/0261424 A1 * 11/2006 Van Der Wiel ..... B60C 23/0408
257/417

FOREIGN PATENT DOCUMENTS

CN 101501505 A 8/2009
CN 103454018 A 12/2013
(Continued)

OTHER PUBLICATIONS

Chinese First office action, Chinese application No. 201910272024. 5, dated Jun. 1, 2021 (21 pages).
(Continued)

*Primary Examiner* — Benjamin R Schmitt

(57) ABSTRACT

The present disclosure provides a composite sensor and a manufacturing method thereof. The composite sensor includes: a first substrate and a second substrate configured to be laminated with the first substrate; a pressure sensor located on the first substrate and configured to sense a change in external pressure; and an acceleration sensor located on the second substrate and configured to sense a change in acceleration. A pressure film of the pressure sensor is configured to be spaced from the second substrate to form a pressure cavity, and a proof mass of the acceleration sensor is configured to be spaced from the first substrate to form a first anti-collision cavity. The present disclosure may reduce the chip area and reduce mutual interference.

19 Claims, 4 Drawing Sheets

(51) Int. Cl.
*G01L 27/00* (2006.01)
*G01P 15/08* (2006.01)

(52) U.S. Cl.
CPC ............... *B81B 2201/0235* (2013.01); *B81B 2201/0264* (2013.01); *G01L 27/005* (2013.01); *G01P 2015/0828* (2013.01)

(56) References Cited

FOREIGN PATENT DOCUMENTS

| | | | |
|---|---|---|---|
| CN | 103708406 | A | 4/2014 |
| CN | 106783998 | A | 7/2016 |
| CN | 107923750 | A | 4/2018 |
| DE | 102016114431 | A1 | 5/2017 |
| TW | 201722844 | A | 7/2017 |
| WO | WO9527215 | A1 | 10/1995 |

OTHER PUBLICATIONS

Patent approval certificate, Taiwan's application No. 109110086, dated Jun. 15, 2021 (4 pages).
Notice of examination in Taiwan, Taiwan's application No. 109110086, dated Jan. 20, 2021 (7 pages).

\* cited by examiner

COMPOSITE SENSOR AND MANUFACTURING METHOD THEREOF

CROSS-REFERENCE TO RELATED APPLICATIONS

The present application claims foreign priority of Chinese Patent Application No. 201910272024.5, filed on Apr. 4, 2019 in the National Intellectual Property Administration of China, the entire contents of which are hereby incorporated by reference.

TECHNICAL FIELD

The present disclosure relates to the technical field of sensors, particularly to a composite sensor and a manufacturing method thereof.

BACKGROUND

A sensor, as a detection device, may sense measured information and convert the sensed information into electrical signals or information in other required forms for output in accordance with a certain rule, thereby giving people an intuitive feeling.

A pressure sensor and an acceleration sensor are two rather common types of sensors, and they are often used simultaneously. For the sake of conveniences during the simultaneous use of the pressure sensor and the acceleration sensor, it is customary in the related art to integrate the two together to form a whole, thereby achieving integration of the pressure sensor and the acceleration sensor. At present, there are mainly three solutions for integrating the pressure sensor and the acceleration sensor, namely, the first solution is manufacturing the pressure sensor and the acceleration sensor in a same plane, the second solution is embedding the pressure sensor into a proof mass of the acceleration sensor, and the third solution is adopting a three-dimensional stacking structure, yet with a pressure film directly exposed within accessible space of the proof mass of the acceleration sensor.

Although the above first solution may achieve the integration of pressure sensing and acceleration sensing, a size of the integrated chip is relatively large. Although the above second solution may reduce the size of the chip after the integration of the two, it is customary in practice to configure a protective cover plate on the acceleration sensor so as to protect a movable structure of the acceleration sensor; in order to adjust dynamic performance of the acceleration sensor, a sealed cavity is configured between the protective cover plate and the movable structure of the acceleration sensor, where an interior of the sealed cavity is made vacuum or filled with inert gas (e.g., nitrogen) with a certain pressure to adjust air damping; and if the pressure sensor is embedded into the proof mass of the acceleration sensor, the pressure sensor, after being sealed by the protective cover plate, will be isolated from the outside and thus lose its detection function. In the third solution, since the pressure film is directly exposed within the accessible space of the proof mass of the acceleration sensor, there may be mutual interference between pressure and acceleration; and when the acceleration is overloaded, there may be a risk of damage to the pressure film. Therefore, as for how to not only reduce the chip area but also realize the functions of the acceleration sensor and the pressure sensor after the integration of the acceleration sensor and the pressure sensor, it becomes a current problem to be solved urgently.

SUMMARY

The technical problem mainly solved by the present disclosure is how to reduce the chip area of the composite sensor and mutual interference to improve reliability of the chip.

To solve the above technical problem, a technical solution adopted by the present disclosure is to provide a composite sensor. The composite sensor includes: a first substrate, and a second substrate configured to be laminated with the first substrate; a pressure sensor located on the first substrate and configured to sense a change in external pressure; an acceleration sensor located on the second substrate and configured to sense a change in acceleration. A pressure film of the pressure sensor is configured to be spaced from the second substrate to define a pressure cavity between the pressure film and the second substrate, and a proof mass of the acceleration sensor is configured to be spaced from the first substrate to define a first anti-collision cavity between the proof mass and the first substrate.

To solve the above technical problem, another technical solution adopted by the present disclosure is to provide a method for manufacturing a composite sensor. The method includes: providing a first substrate and a second substrate; forming a pressure sensor by using a part of the first substrate, and forming an acceleration sensor by using a part of the second substrate; configuring the first substrate and the second substrate to be laminated, wherein a pressure film of the pressure sensor is configured to be spaced from the second substrate to define a pressure cavity between the pressure film and the second substrate, and a proof mass of the acceleration sensor is configured to be spaced from the first substrate to define a first anti-collision cavity between the proof mass and the first substrate.

Advantageous effects of the present disclosure are as follows: the composite sensor provided by the present disclosure, distinct from the related art, forms a pressure cavity by laminating a first substrate and a second substrate and spacing a pressure film of the first substrate from the second substrate, and forms a first anti-collision cavity by spacing a proof mass of the second substrate from the first substrate. Therefore, the pressure sensor and the acceleration sensor are configured to be laminated to reduce the chip size, and the pressure film and the proof mass are configured to be isolated from each other to reduce mutual interference between the pressure sensor and the acceleration sensor.

DETAILED DESCRIPTION

The present disclosure is described in detail below in conjunction with the drawings and embodiments.

Figure 1:
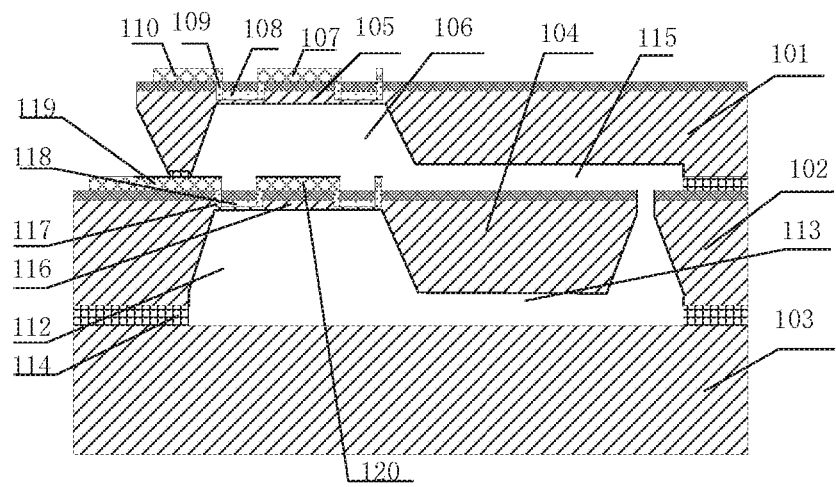
FIG. 1 is a cross-sectional diagram of a first embodiment of a composite sensor according to the present disclosure.

Reference is made to FIG. 1, which is a cross-sectional diagram of a first embodiment of a composite sensor according to the present disclosure. The provided composite sensor includes a pressure sensor and an acceleration sensor. Specifically, the composite sensor includes: a first substrate 101 and a second substrate 102 that are configured to be laminated; a pressure sensor located on the first substrate 101, where the pressure sensor includes a pressure film 105 configured to sense a change in external pressure; and an acceleration sensor located on the second substrate 102, where the acceleration sensor includes a proof mass 104 configured to sense a change in acceleration. Therein, the pressure film 105 is configured to be spaced from the second substrate 102 to form a pressure cavity 106; and the proof mass 104 is configured to be spaced from the first substrate 101 to form a first anti-collision cavity 115. It should be noted that, in the present embodiment, the pressure film 105 and the proof mass 104 are configured to be staggered; e.g., the pressure film 105 is not arranged directly above the proof mass 104. The above structure may completely isolate the pressure film 105 of the pressure sensor from the proof mass 104 of the acceleration sensor, thereby avoiding collision between the pressure sensor and the acceleration sensor when the composite sensor is in operation.

The pressure cavity 106 is formed by recessing a surface of the first substrate 101 adjacent to the second substrate 102, and a thickness of the first substrate 101 at a position of the pressure cavity 106 is reduced to form the pressure film 105. Specifically, the pressure cavity 106 and the first anti-collision cavity 115 are etched on the first substrate 101 with uniform thickness, the first anti-collision cavity 115 configured to be in communication and parallel with the pressure cavity 106, where a depth of the first anti-collision cavity 115 is smaller than a depth of the pressure cavity 106. The remaining first substrate 101 above the pressure cavity 106 serves as the pressure film 105 whose periphery is provided with a first piezo-resistor 108.

Figure 2A:
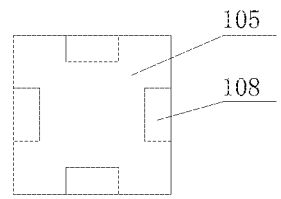
FIG. 2a is a structural diagram of a pressure film and a piezo-resistor of a composite sensor according to the present disclosure.

As shown in FIG. 2a and FIG. 1, the first piezo-resistors 108 are embedded at the periphery of the pressure film 105. In the present embodiment, the first piezo-resistors 108 are four in number. In other embodiments, five or six piezo-resistors may also be configured, and the specific number is not limited herein. First contact holes 109 (not shown in FIG. 2a) are provided on both sides of the first piezo-resistor 108. A first wire 107, which is provided above the pressure film 105, connects the first piezo-resistors 108 in series through the first contact holes 109. A first pad 110, which is further provided outside the pressure film 105 of the first substrate 101, is connected to the first piezo-resistors 108 through the first contact holes 109.

The proof mass 104 is configured to correspond to the first anti-collision cavity 115, and when vibrating in a direction towards the first substrate 101, at least partially falls into the first anti-collision cavity 115 and does not touch the first substrate 101. Specifically, the second substrate 102 with a uniform thickness is etched with a cantilever cavity 112 and a second anti-collision cavity 113 having a depth smaller than that of the cantilever cavity 112. The position of the second anti-collision cavity 113 corresponds to the position of the first anti-collision cavity 115. A thickness of the second substrate 102 at the position of the second anti-collision cavity 113 is reduced to form the proof mass 104. The remaining second substrate 102 above the cantilever cavity 112 serves as a cantilever beam 116 whose periphery is provided with a second piezo-resistor 118.

Figure 2B:
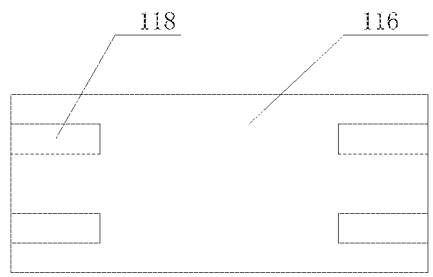
FIG. 2b is a structural diagram of a cantilever beam and a piezo-resistor of a composite sensor according to the present disclosure.

As shown in FIG. 2b and FIG. 1, the second piezo-resistors 118 are embedded at the periphery of the cantilever beam 116. In the present embodiment, the second piezo-resistors 118 are four in number. In other embodiments, five or six piezo-resistors may also be configured, and the specific number is not limited herein. Second contact holes 117 (not shown in FIG. 2b) are provided on both sides of the second piezo-resistor 118. A second wire 120, which is provided above the cantilever beam 116, connects the second piezo-resistors 118 in series through the second contact holes 117. A second pad 119, which is further provided outside the cantilever beam 116 of the second substrate 102, is connected to the second piezo-resistors 118 through the second contact holes 117.

In the above embodiment, an end of the proof mass 104 is connected to the remaining second substrate 102 via the cantilever beam 116, such that the proof mass 104 is suspended in the second substrate 102 via the cantilever beam 116. In another embodiment, two opposite ends of the proof mass 104 are provided with cantilever beams 116, and the two opposite ends are connected to the second substrate 102 via the cantilever beams 116, such that the proof mass is suspended in the second substrate 102.

The composite sensor further includes a third substrate 103 located on a surface of the second substrate 102 away from the first substrate 101. The third substrate 103 and the second substrate 102 are configured to be laminated. Moreover, the first substrate 101 and the second substrate 102 are connected to each other by an adhesive 114, and the second substrate 102 and the third substrate 103 are connected to each other by an adhesive 114, such that the pressure cavity 106, the first anti-collision cavity 115, the cantilever cavity 112 and the second anti-collision cavity 113 are in communication and a sealed cavity is formed. Specifically, a surface of the first substrate 101 (a surface opposite to the first piezo-resistor) is bonded to a surface of the second substrate 102 (a same surface as the second piezo-resistor), and a surface of the second substrate 102 (a surface opposite to the second piezo-resistor) is bonded to a surface of the third substrate.

Material of the third substrate 103 is one or any combination of silicon material and glass material, and material of the first substrate 101 and the second substrate 102 is one or any combination of silicon material and silicon on insulator.

Figure 3:
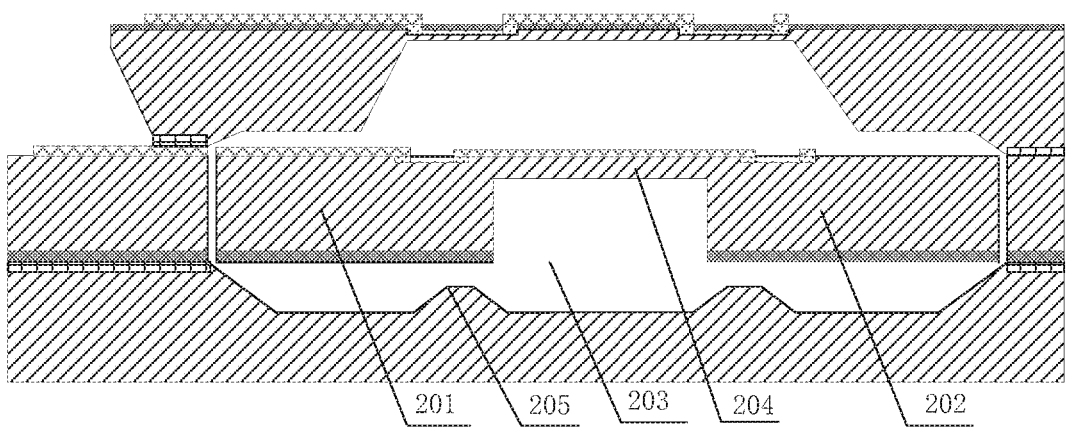
FIG. 3 is a cross-sectional diagram showing a structure of a second embodiment of a composite sensor according to the present disclosure.

Reference is made to FIG. 3, which is a diagram showing a structure of a second embodiment of a composite sensor according to the present disclosure. The difference between the second embodiment and the previous embodiment shown in FIG. 1 lies in that: in the second embodiment, the acceleration sensor has a dual-axis or tri-axis composite sensor structure. Specifically, the second substrate 102 includes two proof masses 201 and 202. Specifically, the proof masses are square. Further, two adjacent ends of the two proof masses 201 and 202 are connected via left and right sides of a double-end clamped beam 204, respectively, and the remaining three ends of each of the two proof masses 201 and 202 are disconnected from the second substrate. The front and back ends of the double-end clamped beam 204 are connected to the second substrate 102 such that the proof masses 201 and 202 are suspended. In addition, in order that the proof masses 201 and 202 are suspended without interference during vibration, in an embodiment, the third substrate 103 is etched with a third anti-collision cavity 203 which is further provided with a stopper 205 to prevent the proof masses 201 and 202 during downward vibration from adhesion to the third substrate 103. In some embodiments, at least one stopper 205 may be arranged under one of the proof masses 201 and 202. The stopper 205 may be a protrusion protruding a bottom face of the third anti-collision cavity 203. The protrusion may have a shape of a column (such as a cylinder), a partial sphere (such as a hemisphere) or a frustum. The height of the stopper 205 may be greater than the depth of the third anti-collision cavity 203 and smaller than the depth of the third anti-collision cavity 203. For example, the height of the stopper 205 may be half the depth of the third anti-collision cavity 203.

Figure 5A:
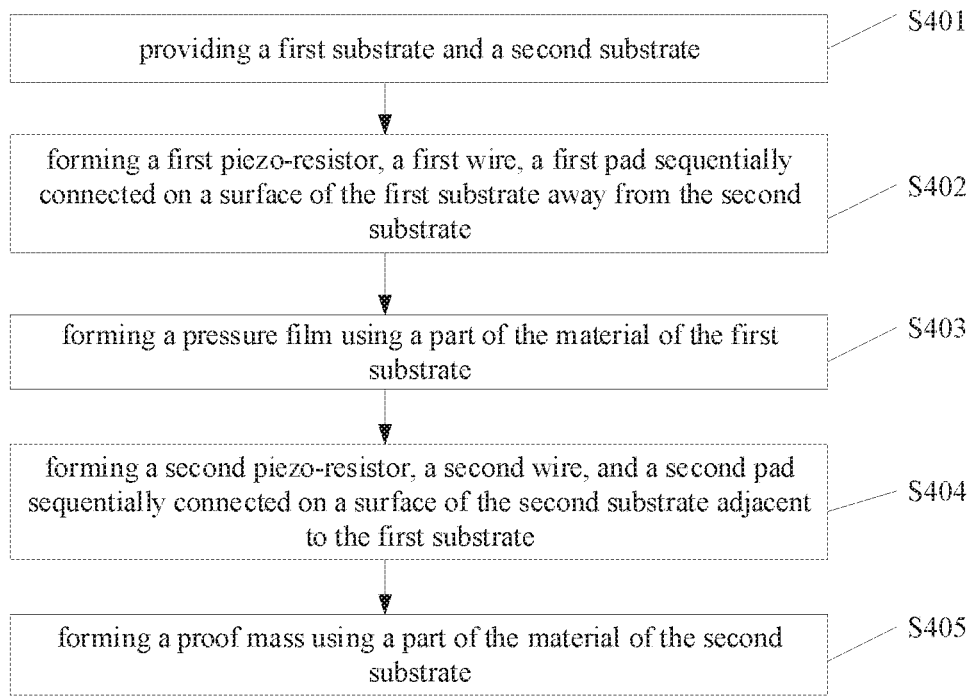
FIGS. 5a-5b are flowchart diagrams of a method for manufacturing a composite sensor according to the present disclosure.
Figure 5B:
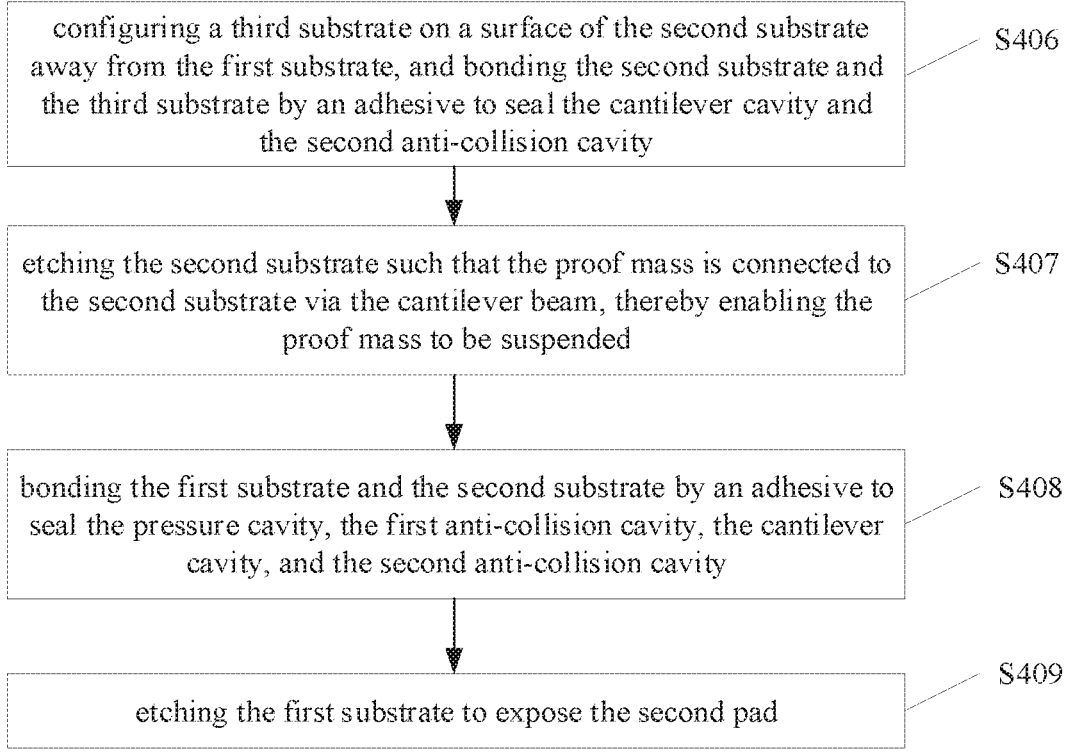

Reference is made to FIGS. 5a to 5b, which are flowchart diagrams of a method for manufacturing a composite sensor according to the present disclosure. Specifically, step S401 is: providing a first substrate and a second substrate.

The first substrate and the second substrate are made of silicon material or silicon on insulator (SOI).

Step S402 is: forming a first piezo-resistor, a first wire, a first pad sequentially connected on a surface of the first substrate away from the second substrate.

Figure 4A:
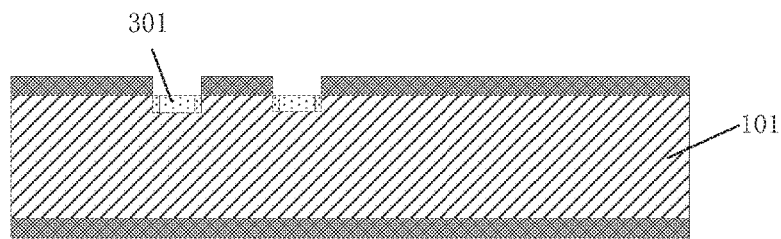
FIGS. 4a-4h are schematic diagrams to explain steps of manufacturing a composite sensor according to the present disclosure.
Figure 4B:
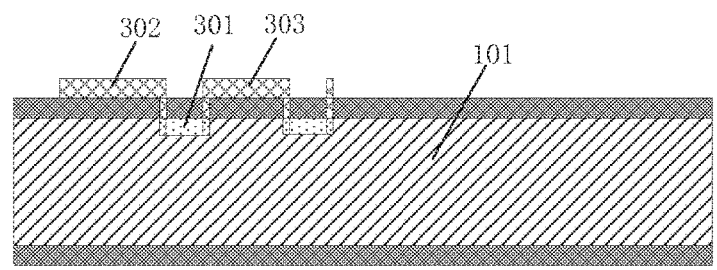

Specifically, reference is made to FIGS. 4a and 4b. In FIG. 4a, a surface of the first substrate 101 is first thermally oxidized, and then subjected to photolithography and etching to remove a part of the silicon dioxide to form a groove on the first substrate 101. Boron ions are implanted into the groove to form a first piezo-resistor 301 on a surface of the first substrate 101. In order to improve a contact effect of the piezo-resistor 301, when ion implantation is performed in the groove to form the piezo-resistor 301, both ends of the piezo-resistor 301 adopt heavy doping implantation with boron ions, and the intermediate region adopts shallow doping implantation with boron ions.

In FIG. 4b, a first wire and a first pad are manufactured on the first substrate 101. Specifically, the first wire 303, the first pad 302, and the first piezo-resistor 301 are located on a same surface of the first substrate 101; the first wire 303 on the first substrate 101 connects the first piezo-resistors 301 through contact holes; and the first pad 302 is located at a periphery of the first substrate 101 and is connected to the first piezo-resistor 301.

Step S403 is: forming a pressure film using a part of the material of the first substrate.

Figure 4C:
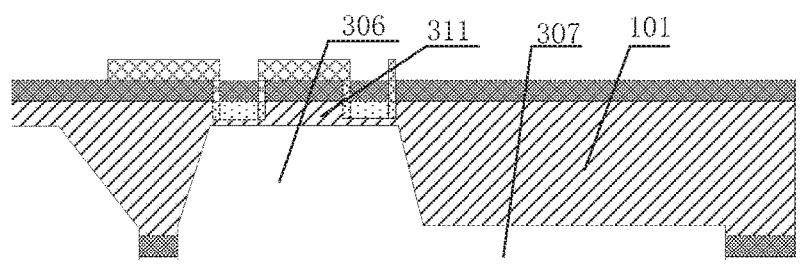

Referring to FIG. 4c, another surface of the first substrate 101 (that is, a surface opposite to the position of the first piezo-resistor) is subjected to photolithography and etching to form a pressure cavity 306 and a first anti-collision cavity 307. The pressure cavity 306 and the first anti-collision cavity 307 are formed by recessing the first substrate 101. A depth of the first anti-collision cavity 307 is smaller than that of the pressure cavity 306. The position of the pressure cavity 306 corresponds to the region of the piezo-resistor 301, and the remaining substrate above the pressure cavity 306 serves as a pressure film 311.

Step S404 is: forming a second piezo-resistor, a second wire, and a second pad sequentially connected on a surface of the second substrate adjacent to the first substrate.

Figure 4D:
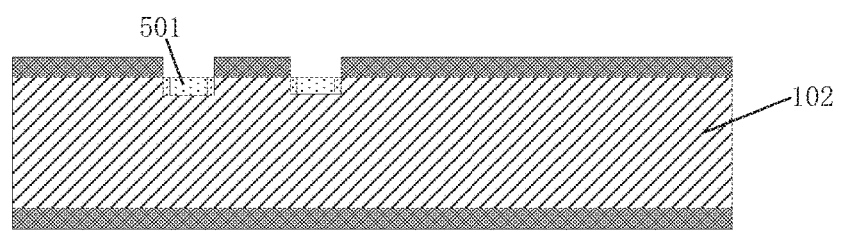
Figure 4E:
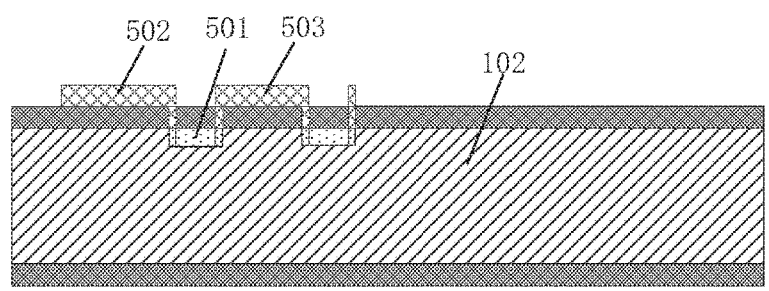

Specifically, reference is made to FIG. 4d and FIG. 4e. In FIG. 4d, a surface of the first substrate 102 is first thermally oxidized, and then subjected to photolithography and etching to remove a part of the silicon dioxide to form a groove the first substrate 102. Boron ions are implanted into the groove to form a second piezo-resistor 501 on a surface of the second substrate 102. In order to improve a contact effect of the piezo-resistor 501, when ion implantation is performed in the groove to form the piezo-resistor 501, both ends of the piezo-resistor 501 adopt heavy doping implantation with boron ions, and the intermediate region adopts shallow doping implantation with boron ions.

In FIG. 4e, a second wire and a second pad are manufactured on the second substrate 102. Specifically, the second wire 503, the second pad 502, and the second piezo-resistor 501 are located on a same surface of the first substrate 101; the second wire 503 on the second substrate 102 connects the second piezo-resistors 501 through contact holes; and the second pad 502 is located at a periphery of the second substrate 102 and is connected to the second piezo-resistor 501.

Step S405 is: forming a proof mass using a part of the material of the second substrate.

Figure 4F:
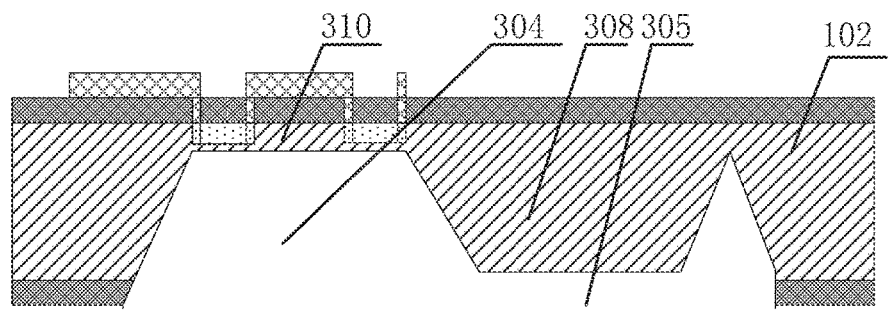

Referring to FIG. 4f, another surface of the second substrate 102 (that is, a surface opposite to the position of the second piezo-resistor) is subjected to photolithography and etching to form a cantilever cavity 304, a second anti-collision cavity 305 and a proof mass 308. The second anti-collision cavity 305 and the cantilever cavity 304 are formed by recessing the second substrate 102. The position of the cantilever cavity 304 corresponds to the position region of the second piezo-resistor. Further, a depth of the second anti-collision cavity 305 is smaller than that of the cantilever cavity 306. The remaining substrate above the cantilever cavity 304 serves as a cantilever beam 310, and the remaining substrate above the second anti-collision cavity 305 serves as the proof mass 308.

Referring to FIG. 5b, the method for manufacturing a composite sensor according to the present disclosure further includes the following steps.

Step S406 is: configuring a third substrate on a surface of the second substrate away from the first substrate, and bonding the second substrate and the third substrate by an adhesive to seal the cantilever cavity and the second anti-collision cavity.

Figure 4G:
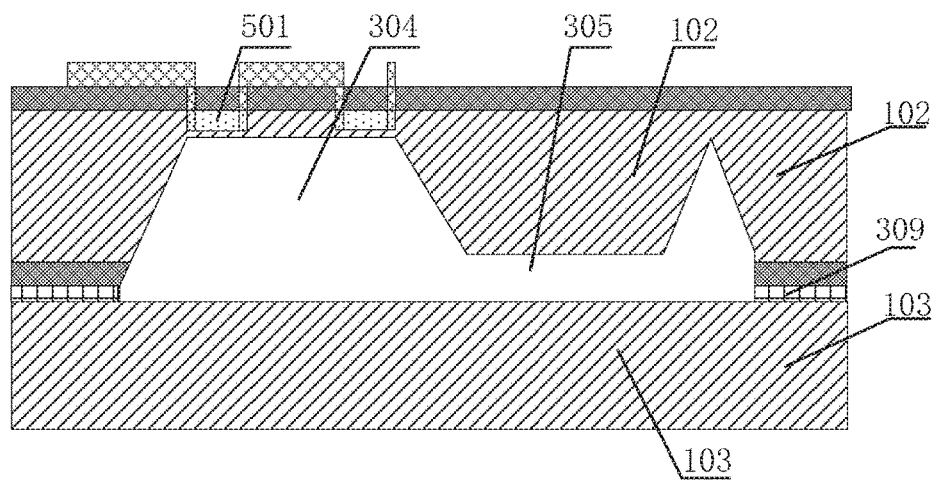

Referring to FIG. 4g, specifically, a surface of the second substrate 102 having the cantilever cavity 304 (a surface opposite to the second piezo-resistor 501) and a surface of another complete substrate (i.e., the third substrate 103) are hermetically bonded by an adhesive 309, such that the cantilever cavity 304 and the second anti-collision cavity 305 form sealed space.

It should be noted that, in the present embodiment, in order to ensure that the proof mass 308, during vibration, does not adhere to the third substrate, a stopper may be provided within the second anti-collision cavity, or the surface of the third substrate 103 adjacent to the second substrate is etched with a groove within which a stopper is reserved.

Step S407 is: etching the second substrate such that the proof mass is connected to the second substrate via the cantilever beam, thereby enabling the proof mass to be suspended.

Figure 4H:
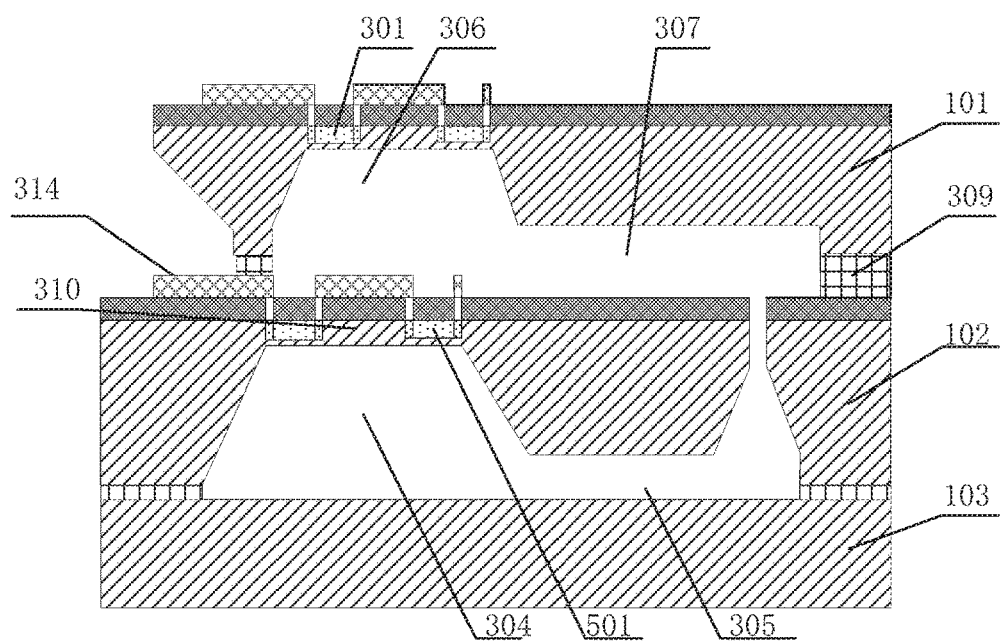

As shown in FIG. 4h, the substrate around the proof mass 308, except the cantilever beam 310 connected to the substrate, is removed such that the proof mass is suspended via the cantilever beam 310.

In another embodiment, two opposite ends of the proof mass 308 are connected to the second substrate 102 via cantilever beams 310. When the etching is performed, the remaining portion other than the portion where the proof mass is connected to the cantilever beam is removed such that the proof mass 308 is suspended.

Step S408 is: bonding the first substrate and the second substrate by an adhesive to seal the pressure cavity, the first anti-collision cavity, the cantilever cavity, and the second anti-collision cavity.

As shown in FIG. 4h, specifically, a surface of the first substrate 101 (a surface opposite to the position of the first piezo-resistor 301) and a surface of the second substrate (a same surface as the position of the second piezo-resistor 501) are hermetically bonded by the adhesive 309. It should be noted that, during the bonding, the position of the proof mass corresponds to the position of the first anti-collision cavity to prevent the proof mass during its vibration from contacting the substrate. The pressure cavity 306, the first anti-collision cavity 307, the cantilever cavity 304, and the second anti-collision cavity 305 are configured to be in communication and sealed.

Step S409 is: etching the first substrate to expose the second pad.

As shown in FIG. 4h, the second pad 314 is configured to be connected to an external circuit. Therefore, the second pad 314 needs to be exposed, and the first substrate is processed via etching, to release the second pad 314.

In the present embodiment, the step S409 is performed after the first substrate is bonded to the second substrate. In another embodiment, the step S409 may be performed before the first substrate is bonded to the second substrate.

In the present embodiment, the composite sensor merely describes some related functional components. Other functional components are the same as functional components of the composite sensor in the related art, and details are not described herein.

The composite sensor provided in the present disclosure reduces the size of the chip by laminating the pressure sensor and the acceleration sensor, and reduces mutual interference between the pressure sensor and the acceleration sensor by isolating the pressure film of the pressure sensor from the proof mass of the acceleration sensor.

The foregoing are only embodiments of the present disclosure, and are not intended to limit the patent scope of the present disclosure. Any equivalent structure or equivalent flow transformation made based on the description and drawings of the present disclosure, or applied directly or indirectly to other related technical fields, shall be likewise included in the scope of patent protection of the present disclosure.

What is claimed is:

1. A composite sensor, comprising:
   a first substrate;
   a second substrate laminated with the first substrate;
   a pressure sensor located on the first substrate and configured to sense a change in external pressure; and
   an acceleration sensor located on the second substrate and configured to sense a change in acceleration;
   wherein a pressure film of the pressure sensor is configured to be spaced from the second substrate to define a pressure cavity between the pressure film and the second substrate, and a proof mass of the acceleration sensor is configured to be spaced from the first substrate to define a first anti-collision cavity between the proof mass and the first substrate, and
   a surface of the second substrate away from the first substrate is recessed at a position corresponding to the pressure cavity, such that the second substrate has a recessed portion and a non-recessed portion, and the non-recessed portion serves as the proof mass.

2. The composite sensor according to claim 1, wherein the pressure cavity is formed by recessing a surface of the first substrate adjacent to the second substrate, and a thickness of the first substrate at a position of the pressure cavity is reduced to form the pressure film.

3. The composite sensor according to claim 2, wherein the first anti-collision cavity and the pressure cavity are arranged side by side and are communicated, the first anti-collision cavity is formed by recessing the surface of the first substrate adjacent to the second substrate, and a depth of the first anti-collision cavity being smaller than a depth of the pressure cavity; and
   wherein the proof mass is configured to correspond to the first anti-collision cavity, and when vibrating in a direction towards the first substrate, at least partially falls into the first anti-collision cavity and does not contact the first substrate.

4. The composite sensor according to claim 3, wherein the surface of the second substrate away from the first substrate is recessed at the position corresponding to the pressure cavity to form a cantilever cavity, and a thickness of the second substrate at a position corresponding to the cantilever cavity is reduced to form a cantilever beam.

5. The composite sensor according to claim 4, wherein the surface of the second substrate away from the first substrate is recessed at a position corresponding to the first anti-collision cavity to form a second anti-collision cavity, a depth of the second anti-collision cavity is smaller than a depth of the cantilever cavity, and a thickness of the second substrate at a position corresponding to the second anti-collision cavity being reduced to form the proof mass; and
   wherein the proof mass, when vibrating in a direction away from the first substrate, at least partially falls into the second anti-collision cavity.

6. The composite sensor according to claim 4, wherein an end of the proof mass is connected to the second substrate via the cantilever beam, such that the proof mass is suspended, thereby enabling the cantilever cavity, the second anti-collision cavity, the first anti-collision cavity and the pressure cavity to be in communication with each other.

7. The composite sensor according to claim 4, wherein two opposite ends of the proof mass are connected to the second substrate via cantilever beams, such that the proof mass is suspended, thereby enabling the cantilever cavity, the second anti-collision cavity, the first anti-collision cavity and the pressure cavity to be in communication with each other.

8. The composite sensor according to claim 4, further comprising:
   a second pad, a second wire, and a second piezo-resistor located at a periphery of the cantilever beam, which are sequentially connected on a surface of the second substrate adjacent to the first substrate.

9. The composite sensor according to claim 1, further comprising:
   a first piezo-resistor, a first wire, and a first pad located at a periphery of the pressure film, which are sequentially connected on a surface of the first substrate away from the second substrate.

10. The composite sensor according to claim 1, further comprising a third substrate located on a surface of the second substrate away from the first substrate, wherein the first substrate is bonded to the second substrate, and the second substrate is bonded to the third substrate.

11. The composite sensor according to claim 10, wherein the third substrate defines a third anti-collision cavity which is provided with a stopper to prevent the proof mass from adhesion to the third substrate.

12. The composite sensor according to claim 10, wherein material of the third substrate is one or any combination of silicon material and glass material, material of the first substrate and the second substrate is one or any combination of silicon material and silicon on insulator, and the first substrate, the second substrate and the third substrate are bonded by an adhesive.

13. A method for manufacturing a composite sensor, comprising:
providing a first substrate and a second substrate;
forming a pressure sensor by using a part of the first substrate, and forming an acceleration sensor by using a part of the second substrate; and
configuring the first substrate and the second substrate to be laminated, wherein a pressure film of the pressure sensor is configured to be spaced from the second substrate to define a pressure cavity between the pressure film and the second substrate, and a proof mass of the acceleration sensor is configured to be spaced from the first substrate to define a first anti-collision cavity between the proof mass and the first substrate, and
performing etching on a surface of the second substrate away from the first substrate to form a cantilever cavity and a second anti-collision cavity, to reduce a thickness of the second substrate at a position corresponding to the second anti-collision cavity to form the proof mass.

14. The method according to claim 13, wherein said forming a pressure sensor by using a part of the first substrate comprises:
forming a first piezo-resistor, a first wire, and a first pad sequentially connected on a surface of the first substrate away from the second substrate.

15. The method according to claim 13, wherein said forming an acceleration sensor by using a part of the second substrate comprises:
forming a second pad, a second wire, and a second piezo-resistor sequentially connected on a surface of the second substrate adjacent to the first substrate.

16. The method according to claim 13, comprising:
performing etching on a surface of the first substrate adjacent to the second substrate to form the pressure cavity and the first anti-collision cavity which are configured to be in communication and arranged side by side, to reduce a thickness of the first substrate at a position of the pressure cavity to form the pressure film.

17. The method according to claim 13, further comprising:
providing a third substrate on the surface of the second substrate away from the first substrate, and bonding the second substrate and the third substrate by an adhesive to seal the cantilever cavity and the second anti-collision cavity.

18. The method according to claim 17, further comprising:
providing a stopper to prevent the proof mass from adhesion to the third substrate, wherein the stopper is provided within the second anti-collision cavity, or the surface of the third substrate adjacent to the second substrate defines a groove within which the stopper is provided.

19. The method according to claim 17, further comprising:
bonding the first substrate and the second substrate by an adhesive to seal the pressure cavity, the first anti-collision cavity, the cantilever cavity, and the second anti-collision cavity.

* * * * *